(12) United States Patent
Rearick et al.

(10) Patent No.: US 7,039,845 B2
(45) Date of Patent: May 2, 2006

(54) METHOD AND APPARATUS FOR DERIVING A BOUNDED SET OF PATH DELAY TEST PATTERNS COVERING ALL TRANSITION FAULTS

(76) Inventors: Jeff Rearick, 3206 Nesbit Ct., Ft Collins, CO (US) 80526; Manish Sharma, 3501 S. Stover Apt. #149, Fort Collins, CO (US) 80525

( * ) Notice: Subject to any disclaimer, the term of this patent is extended or adjusted under 35 U.S.C. 154(b) by 452 days.

(21) Appl. No.: 10/109,018

(22) Filed: Mar. 28, 2002

(65) Prior Publication Data
US 2003/0188246 A1 Oct. 2, 2003

(51) Int. Cl.
*G06F 11/00* (2006.01)

(52) U.S. Cl. .................. 714/738; 714/724; 714/25; 714/37; 716/4

(58) Field of Classification Search .................. 714/25, 714/33, 37, 724; 702/118; 716/4; 324/765
See application file for complete search history.

(56) References Cited

U.S. PATENT DOCUMENTS 5,600,787 A * 2/1997 Underwood et al. .......... 714/30
6,018,813 A * 1/2000 Chakradhar et al. ........ 714/724
6,453,437 B1 * 9/2002 Kapur et al. ................ 714/741
2002/0112213 A1 * 8/2002 Abadir et al. ............... 716/4
2003/0079189 A1 * 4/2003 Abadir et al. ............... 716/4
2003/0115526 A1 * 6/2003 Fetherson ................... 714/738

OTHER PUBLICATIONS

Majhi et al., "Delay Fault Models and Coverage", Jan. 4-7, 1998, IEEE VLSI Design Proceedings 1998, pp. 364-369.*
Sharma et al., "Bounding Circuit Delay by Testing a Very Small Subset of Paths", Apr. 30-May 4, 2000, IEEE VLSI Test Symposium Proceedings 2000, pp. 333-341.*
Tsukiyama et al., "Techniques to remove false paths in statistical static timing analysis", □□ASIC, 2001. Proceedings. 4th International Conference on Oct. 23-25, 2001 □□pp.: 39-44.*

* cited by examiner

*Primary Examiner*—Albert DeCady
*Assistant Examiner*—John P. Trimmings

(57) ABSTRACT

A method and apparatus for generating test patterns used to test an integrated circuit (IC). The apparatus comprises first logic for determining a subset of transition fault sites on an IC to be tested, second logic that identifies a longest sensitizable path through each transition fault site of the subset of transition fault sites, and third logic that generates a bounded set of test patterns that test the identified longest sensitizable paths through each transition fault site of the subset of transition fault sites. The present invention combines various aspects of transition fault modeling and path delay fault modeling to enable global delay testing of an IC within reasonable amount of time.

17 Claims, 5 Drawing Sheets

METHOD AND APPARATUS FOR DERIVING A BOUNDED SET OF PATH DELAY TEST PATTERNS COVERING ALL TRANSITION FAULTS

TECHNICAL FIELD OF THE INVENTION

The present invention is generally related to integrated circuits (ICs) and, more particularly, to deriving a bounded set of path delay test patterns, for testing ICs for defects.

BACKGROUND OF THE INVENTION

After an IC is manufactured, it is tested on an IC tester before it is shipped to a customer. The goal of the testing is to verify that each individual IC was manufactured correctly without defects. At the highest level, testing may be reduced to simply plugging the IC into a host system and determining whether the system appears to be functioning normally while running applications. If the system works, then a determination may be made that the IC is ready to be shipped. However, this type of system-level test does not ensure that the IC is defect free, since the given applications used may exercise only a subset of the IC's functionality. This type of high-level system-based testing also requires a relatively large amount of time.

An alternative to the system test approach is known as functional testing. This type of testing is performed on a general-purpose IC tester (known as Automated Test Equipment, or ATE). This type of testing applies logic 1s and/or 0s to the input pins of the IC in order to stimulate all of the logic gates within the IC, and determines whether each logic gate outputs the correct result by observing the output pins of the IC. The patterns applied to and the results expected from each IC pin are stored in memory on the ATE and exercise the various functional aspects of the IC. If the IC responds correctly to all test stimuli, it is considered to be of shipment quality. However, given the complexity and sequential depth of modern ICs, creating a sufficiently thorough test to be applied via the pins is very difficult, and given the large number of pins on some ICs, the cost of the ATE resources can become prohibitive.

A third alternative to the system testing and functional testing approaches is known as structural testing. Instead of exercising the functional aspects of the IC, this type of testing applies logic 1s and/or 0s internally to stimulate all of the logic gates within the IC, and determines whether each logic gate outputs the correct result, again internally. This internal controllability and observability is obtained by using modified memory elements (flip-flops) inside the IC that are serially connected into a scan chain during test mode. This well-known technique of "scan design" has been in wide use for many years. In "full scan" designs, every internal flip-flop in the IC is made "scannable" by adding a serial access to a predecessor flip-flop and a successor flip-flop on the scan path during test mode. Thus, all the logic gates on the IC are surrounded by scannable flip-flops and become combinationally testable. In order to perform a scan test, data is serially shifted into all of the flip-flops in the scan path while the IC is in test mode, the resulting response of the logic gates to the final scanned-in state stimulus is captured by clocking all the flip-flops one or more times while the IC is in normal mode, and then the newly captured data is serially shifted out of the IC while in test mode. The captured data is analyzed by the ATE as it is shifted out to determine whether the correct results were obtained. The ATE is also responsible for switching the IC between normal and test modes appropriately as well as for providing the clock stimulus.

In order to create a structural test, a software tool uses a simulation model of the IC, which includes the scan flip-flops and all of the combinational logic of the IC. A "fault model" that represents hypothesized defects is superimposed on the simulation model of the IC in order to guide the creation of specific test patterns (also called test vectors) that are intended to expose faulty logic gates. The software tool then generates test patterns for each location in the IC model at which a fault, or defect, could exist. Each test pattern is a set of 1s and 0s that are necessary to excite and propagate the hypothesized fault to an observation point (i.e., a scannable flip-flop), as well as the expected response of a defect-free IC. If an IC responds to such a pattern with data other than that expected, then the hypothesized fault is deduced to be present and the IC is thus determined to be defective and is not shipped. The complete set of test patterns (called a test sequence or a test set) is intended to cover all possible faults in an IC.

The spectrum of all possible faults in an IC is, unfortunately, very broad. While many defects result in permanent logical errors that can be easily detected by scan-based tests, some defects manifest themselves only as increased delays in the IC. Therefore, if the scan test is performed without taking the speed at which the gates should respond into account, such "delay defects" may go undetected. For example, assuming a NOR gate that has a weak pull down transistor, the gate may produce the correct logical value if given enough time, but will not produce the value correctly under the timing specifications for the IC. Therefore, each gate must be checked to determine whether its logical function is correctly performed and whether it is performed in a timely fashion. A pattern that does not take timing into account is called a "static" test, while one that does execute under timing constraints is called a "dynamic" test. A dynamic test for a given logic gate is created by running two test patterns in sequence at full clock speed and determining whether a slow-to-rise (STR) or slow-to-fall (STF) delay fault exists.

For example, if one input of a two-input NOR gate is held at 0 for two clock cycles while the other input changes from a 0 on the first clock cycle to a 1 on the second clock cycle, the output should change from a 1 on the first clock cycle to a 0 on the second clock cycle. If the output does not change from a 1 to a 0 within specified timing margins, a slow-to-fall (STF) fault exists. Similarly, if one input of the NOR gate is held at 0 for two clock cycles while the other input changes from a 1 on the first clock cycle to a 0 on the second clock cycle, the output should change from a 0 on the first clock cycle to a 1 on the second clock cycle. If the output does not change from a 0 to a 1 within specified timing margins, a slow-to-rise (STR) fault exists.

FIG. 1 is a block diagram illustrating a series of scan flip-flops 1, 2, and 3 as well as combinational logic 4 of an IC that incorporates the aforementioned scan design and that can be used for performing static and dynamic tests. Each of the flip-flops 1, 2, and 3 has its data input, D, connected to the output of one of the multiplexers 6, 7, or 8, respectively. When the scan enable signal, SC_EN is low (i.e., not asserted), the data at input 0 of the multiplexers 6, 7, and 8 is captured by the flip-flops 1, 2, and 3, respectively, on the rising edge of the clock, CLK. Therefore, when the scan enable signal SC_EN is not asserted, the IC is functioning in the normal operational manner. The combinational logic 4 will normally receive a plurality of primary input signals 9 originating from the input pins of the IC and will drive a plurality of primary output signals 11 that terminate at the output pins of the IC. The scan chain begins at input S_I 12 and ends at output S_O 13. The flip-flops act as a serial shift register between these two points when the scan enable signal SC_EN is asserted.

The black dots separating flip-flops 2 and 3 are intended to indicate that the scan chain may, and normally does, include many more flip-flops than the three shown in the figure (e.g., 100,000 flip-flops on a contemporary IC is not uncommon). It should be noted that corresponding additional inputs and outputs of the combinational logic 4 are connected to these additional scan flip-flops not shown in FIG. 1 to enable every gate of the combinational logic to be tested using the scan design technique. It should also be noted that several independent scan chains can be used to link groups of flip-flops together instead of one long scan chain as shown.

Given this scan design architecture, several varieties of tests are possible. The first is to establish that the scan chain itself is functional. This is accomplished by asserting the scan enable signal SC_EN (i.e., setting it to logic 1 in this example scan design configuration) and then cycling the clock as many times as there are flip-flops on the scan chain to load the chain, then again that many times to unload the scan chain. The signals at the scan in inputs, S_I, of the multiplexers 6, 7, and 8 are captured by the flip-flops 1, 2, and 3, respectively, on each clock cycle. The first flip-flop on the scan chain captures the S_I input pin 12, and the last flip-flop on the scan chain drives the S_O output pin 13. The scan logic is functioning as one large shift register during this test, with each flip-flop outputting a data value on the rising edge of the clock CLK. During the second half of this test, the expected response of the SO pin 13 should match the values delivered on the S_I pin 12 in the first half of the test.

For example, assuming the scan design logic shown in FIG. 1 comprises 100 flip-flops, 200 clock cycles will be issued to shift a 100-bit test pattern of 1s and/or 0s into the flip-flops and completely out again; SC_EN will be held high over the 200 clock cycles. If all 100 bits appear properly on the S_O pin 13 in order during the second half of the test, then the scan chain is operational.

Once a determination is made that the flip-flops are functioning properly as a scan chain, the combinational logic 4 can be tested. In this case, again assuming 100 flip-flops in the scan design chain, the SC_EN signal will be asserted and 100 clock cycles will be issued to enable a 100-bit test pattern to be shifted into the flip-flops. The final state shifted in at this point in the test is available at the Q-outputs of the flip-flops and corresponds to the stimulus portion of this test pattern. After the combinational logic 4 has settled, the circuit response is available at the 0 inputs of the multiplexers and is captured in the flip-flops by pulsing the clock CLK exactly once with the SC_EN signal held low. Then, by holding the SC_EN signal high and issuing 100 clock cycles, the captured response data is shifted out for analysis. The data shifted out is analyzed by the ATE to determine if the circuit responded to the stimulus properly (against the stored expected response as a reference).

Whether or not this type of test is static or dynamic depends upon the relative timing of the clock signal CLK and the test mode signal SC_EN. A static test would result when there is a pause between the application of the last shift action (the $100^{th}$ clock pulse with SC_EN high in this example) and the application of the capture event (the single clock pulse with SC_EN low). There are two well-known methods for applying dynamic tests. In the first, known as "last-shift-launch" or "skewed-load" testing, the SC_EN signal must be capable of being switched from high to low in between two at-speed clock pulses (the $100^{th}$ and $101^{st}$, in this example). This would apply two test patterns executed in sequence at speed, with the transitions caused by the last shifted state (from CLK 99 to CLK 100) in test mode being captured by CLK 101 in normal mode (just after SC_EN was lowered at speed). Although this is difficult to do, it has been accomplished in the past by carefully designing the SC_EN signal. Due to the difficulty of making the scan enable signal operate at speed, some designs perform transition testing at reduced speed, with consequent reduction in test quality. Alternatively, the second scheme for implementing dynamic tests, known as "functional justification" or "broadside" delay testing, relaxes this demand on the SC_EN signal, but requires two at-speed clocks during the time when SC_EN is low (i.e. during normal operation). This technique loops through the combinational logic 4, not once, but twice, thereby making the burden on the test pattern generation tools twice as great. For example, after the $100^{th}$ pulse of the clock CLK with the scan enable signal SC_EN high, SC_EN can be lowered at leisure, then the clock CLK is pulsed twice in succession at full chip speed. The transitions launched on the first of these two clock pulses are captured by the second pulse. The scan enable signal SC_EN is then asserted at any desired time, and then 100 clock pulses are applied to shift out the captured data. It should be noted that the combinational logic 4 was exercised twice during the time when SC_EN was low.

However they are implemented, dynamic tests are intended to detect delay faults. There are two popular delay fault models, namely, transition faults (also known as gate delay faults) and path delay faults. A transition fault models the situation where a single gate in an IC is slow: it will produce the correct logical output, but it will not be able to produce it in a timely fashion. A path delay fault models the situation where several gates are marginally slow, such that any one of them won't adversely affect the ability of the circuit to run at speed, but the combination of all the incremental delays will cause the circuit to be too slow when a path connecting those gates is sensitized.

Practical usage of the transition fault model is impeded by the greedy nature of test generation algorithms, which tend to select the easiest (i.e., the shortest) route into and out of the gate in question, even when there are other (longer) routes that would make the transition test more sensitive to a given delay defect.

Practical usage of the path delay fault model is impeded by the exponential number of paths in a circuit: testing all possible paths in an IC is a mathematical impossibility.

The manner in which scan-based delay fault testing is currently performed has various disadvantages, which will be described with reference to the schematic diagram of FIG. 2. The schematic diagram of FIG. 2 shows a simple example of what might be found in the combinational logic 20 of an IC. The logic 20 comprises, among other logic gates, an AND gate 21, a NOR gate 22, and a NAND gate 23, which are connected such that they form a portion of a logical path connecting circuit nodes B, C, D, and E. Also shown in the figure are two scan flip-flops 24 and 25, as well as a fault location marked with an "X" at the output of NOR gate 22.

Present transition fault test generation algorithms often take advantage of the direct controllability and observability, respectively, afforded by the scan flip-flops 24 and 25 and would launch and capture a rising transition passing through the fault site by using these short paths into and out of the fault site. This choice, unfortunately, reduces the quality of the transition test pattern, since the length of the path through the fault site is not taken into account in determining whether or not a transition fault is detected by a test pattern. For example, assuming a slow-to-rise (STR) fault is located at the "X" on the output of NOR gate 22, a test pattern which produces two consecutive 0s from AND gate 21 at node C on two consecutive clock cycles while launching a falling transition from flip-flop 24 will be able to observe the fault effect at node D via flip-flop 25 on the second clock cycle. Specifically, if the input to flip-flop 25 does not change from 1 to 0 within the second clock cycle, a determination is made that a transition fault exists. If, however, the input to flip-flop 25 does fall from 1 to 0 within the second clock cycle, a determination is made that no defect exists. The problem with this determination is that a delay defect at this fault site could indeed exist but the delay is just too short in duration to affect the particular (short) path Q-D taken to test it. If, alternatively, this fault were tested by holding the output Q of flip-flop 24 at a constant logic 0 while propagating a transition along path A-B-C-D-E-F, or some other relatively long path through the fault site, then the determination that a passing test does in fact indicate the absence of a defect can be made with much more confidence.

Clearly, the transition fault model does not take into account whether a delay defect will cause an IC to fail when the defect is part of a longer path than that taken to test the transition fault at the defect site. The obvious alternative is to generate delay tests by using the path delay fault model on long paths through the circuit. However, the application of the path delay fault model to an entire circuit results in an exponential explosion in the number of paths, rendering this model useless as a general technique for quantifying delay fault coverage. It is generally only applied for a small subset of the longest (critical) paths in a circuit. This results in (optimal) tests for the critical path subset of all chip paths, but does not provide global coverage of delay defects. Rather, only those delay defects on the relatively few selected paths are detected. The path delay fault model also requires that full chip timing analysis be performed to find the worst paths, then discards the bulk of the data produced.

Furthermore, a set of nodes on a path that is functionally unsensitizable may remain untested, even though these nodes could have been tested via another shorter, but truly, sensitizable path. Path identification does not necessarily determine whether a given path is sensitizable. The phrase "sensitizable path", as that phrase is used herein, is intended to denote any path that can be activated by setting the logic values on gates along the path such that a transition is launched and propagated along the entire path.

The transition fault model, on the other hand, uses a fixed number of fault sites (2 faults per circuit node) and is useful for measuring chip-wide speed coverage. However, the simpler test criteria for the transition fault model allows the incident and departing transition through the target node to propagate through paths in the logic that are relatively short compared to the longest possible path that contains the target node. Any transition test pattern that uses these relatively short paths will be less sensitive in detecting a delay defect than a pattern that uses the longest possible sensitizable path through the target node.

Accordingly, a need exists for a technique that combines the strongest aspects of both of the transition fault model and the path delay fault model in order to provide a test for delay defects that utilizes a bounded set of fault sites and that utilizes the longest sensitizable path through each fault site to perform delay fault testing.

SUMMARY OF THE INVENTION

In accordance with the present invention, a method and apparatus are provided for generating test patterns used to test an integrated circuit (IC). The apparatus comprises first logic that determines a subset of transition fault sites on an IC to be tested, second logic that identifies a longest sensitizable path through each transition fault site of the subset of transition fault sites, and third logic that generates a bounded set of test patterns that test the identified longest sensitizable paths through each transition fault site of the subset of transition fault sites. The present invention combines various aspects of transition fault modeling and path delay fault modeling to enable global testing of an IC within a reasonable amount of time by using a bounded set of test patterns. The bounded set of test patterns is derived using the longest sensitizable paths through each fault site of a subset of fault sites.

The subset of fault sites is obtained by collapsing fault sites such that preferably only two fault sites per node are comprised by the subset. The longest sensitizable path through each fault site of the subset is the used to generate test patterns for testing each fault site of the subset. By generating tests that use the longest sensitizable path through each fault site, defects might not otherwise be detected will be detected, and by limiting the number of fault sites to, for example, two fault sites per node, each node of the combinational logic of the IC can be tested. Therefore, the present invention provides for thorough and sensitive delay defect testing of ICs within a reasonable amount of time.

These and other features and advantages will become apparent from the following description, drawings and claims.

DETAILED DESCRIPTION OF THE PREFERRED EMBODIMENT

Figure 1:
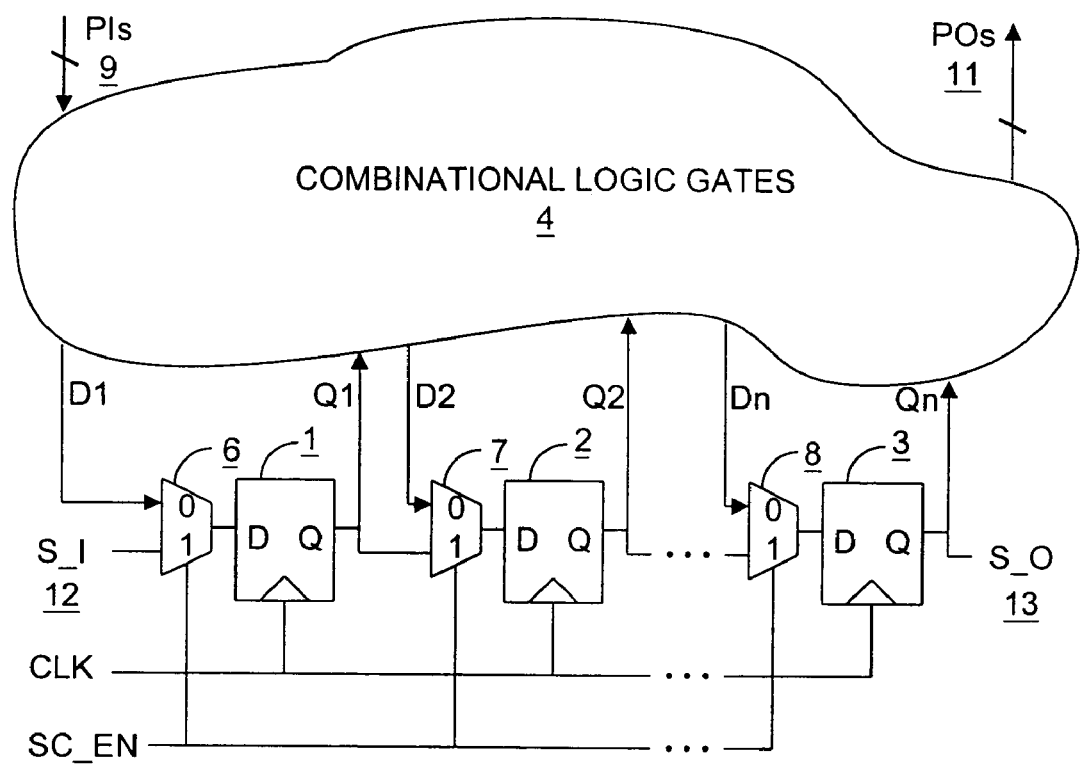
FIG. 1 is a block diagram of scan-based testing logic connected to combinational logic to enable static and dynamic tests to be performed on an IC.

In accordance with the present invention, it has been determined that a transition fault test that uses the shortest path into and out of a transition fault site may result in a defect not being detected that would have been detected if a longer sensitizable path that included the fault site had been tested. In other words, using the shortest path through the fault site during a test run may result in a defect-induced delay being measured that does not use up a prohibitive amount of the clock cycle, thus resulting in a determination that the delay defect does not render the IC faulty. In accordance with the present invention, it has been determined that the highest quality transition fault test is one that uses the longest sensitizable path through the transition fault site. If the delay associated with the longest sensitizable path through the fault site uses up a prohibitive amount of the clock cycle, or more than one clock cycle, then the defect may result in the IC malfunctioning when it is put into operation. Therefore, the test that uses the longest sensitizable path is the most stringent, and thus is the highest quality test A test using the longest sensitizable path through the fault site will detect the smallest defect, and therefore is the highest quality test. This test will also detect larger defects, whereas tests which use short paths that may detect large defects will not detect small defects.

However, as stated above, application of the known path delay fault model, which, by default, tests all paths, has only been applied to subsets of circuits rather than to large circuits, and the paths are not checked for sensitizability. Thus, application of the known path delay fault model to a large circuit is not done because to do so would result in an exponential explosion in the number of paths that would need to be tested. Even when the number of paths is limited to the subset of the longest paths in the circuit, there is no guarantee that all circuit nodes will appear on at least one long path.

In contrast, the known transition fault testing model, uses a fixed number of fault sites (typically 2 faults per circuit node) and is useful for measuring chip-wide speed coverage. However, the simpler test criteria for the transition fault model allows the incident and departing transition through the target node to propagate through paths in the logic that are relatively short compared to the longest possible path that contains the target node. As stated above, any transition test pattern that uses these relatively short paths will be less sensitive in detecting a delay defect than a pattern that uses the longest possible sensitizable path through the target node.

In accordance with the present invention, the longest sensitizable path through each of a fixed number of fault sites is selected and a set of test patterns are generated for these fault sites, thereby obtaining a test which has the global coverage conferred by the transition fault model along with the utilization of long paths conferred by the path delay fault model while avoiding the exponential explosion entailed by enumerating all possible paths in a circuit. The resulting test set can be used to test an entire IC in a reasonable amount of time.

Figure 2:
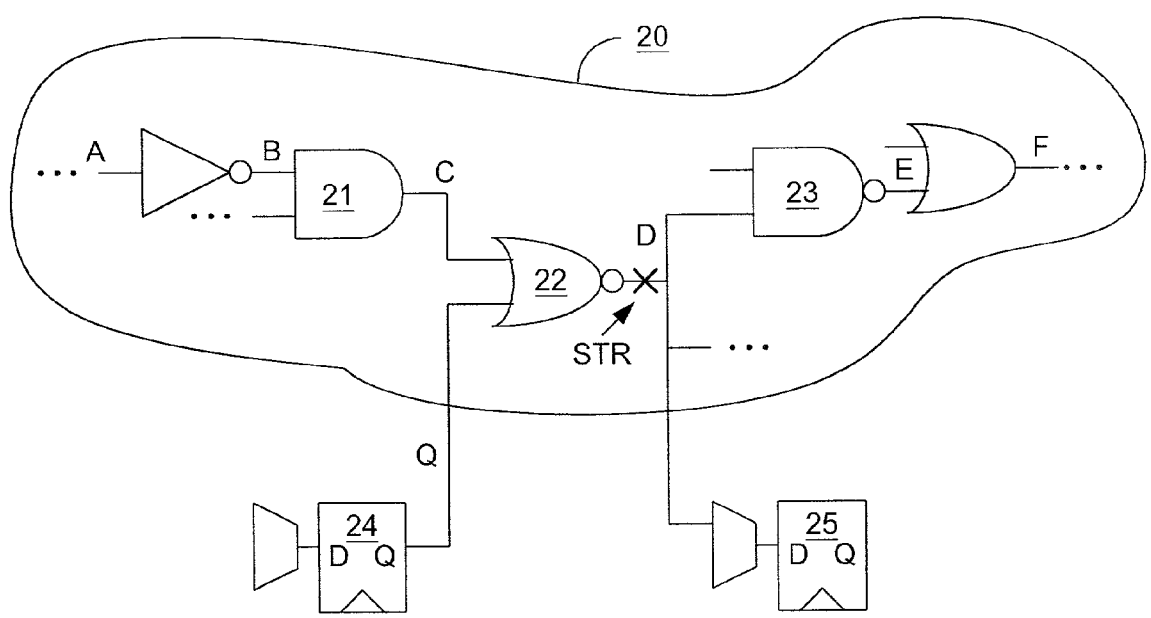
FIG. 2 is a schematic diagram of an example of a portion of combinational logic of an IC that comprises a defect that be detected by performing a transition fault test using the scan design shown in FIG. 1.

The manner in which the "fixed number" of fault sites is determined is through the known fault injection techniques associated with the transition fault model, including the collapsing of identical and equivalent faults. For example, with reference to FIG. 2, the output of AND gate 21 could have two faults, namely, an STR fault or an STF fault. Similarly, the first input of NOR gate 22, which is connected to the output of AND gate 21, could also have two faults, namely, a STR fault and an STF fault. Therefore, although four potential fault locations exist, only two need to be tested since they all correspond to the same node. Therefore, only either the STR and STF faults of the output of AND gate 21 or the STR and STF faults of the corresponding input to the NOR gate 22 need be tested. Note that this collapsing of faults does not apply across circuit fanouts. For example, the output of NOR gate 22 at fanout stem D has potential STR and STF faults that need to be tested, but these two faults are distinguished from (and not collapsible with) the STR and STF faults on each of the fanout branches driving NAND gate 23 and scan flip-flop 25. Other known fault collapsing rules, such as the STF fault at the input of an inverter being collapsible with the STR fault on the output of that same inverter, and vice versa, may also be applied to reduce the number of fault sites which must be considered.

Figure 3:
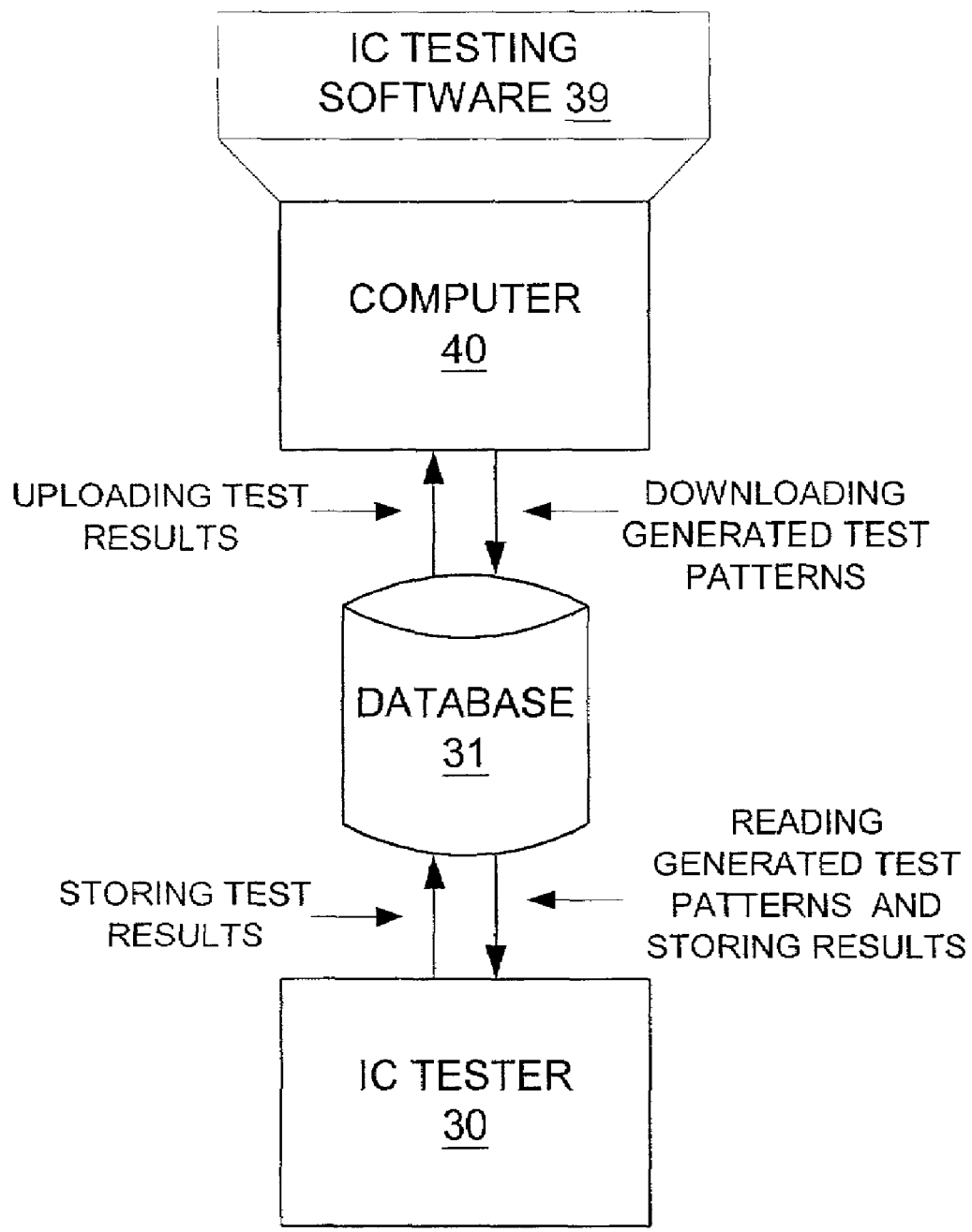
FIG. 3 is block diagram of an IC tester that executes IC test generation software to determine whether or not a defect exists in an IC.

By choosing the longest sensitizable paths through a fault site and by limiting the number of faults to be tested to preferably no more than 2 per node (prior to fault collapsing), a bounded set of long path delay fault test patterns based on these transition fault sites can be generated that enable the entire IC to be tested in a reasonable amount of time FIG. 3 is a diagram that depicts the apparatus of the present invention for testing ICs, which includes an IC tester 30 that applies test patterns stored in a database 31 that have been generated by IC testing software 39 being executed by a computer 40 and downloaded to database 31 for use by the IC tester 30. An IC (not shown) is installed in the IC tester 30 in the typical manner in which ICs are installed in known IC testers for testing. A bounded set of delay test patterns is then applied by the IC tester 30. The results of executing the test patterns are then analyzed to determine whether defects in the IC exist.

The task of analyzing the results of execution of the test patterns may be performed by the IC tester 30 or by some other computational device. In accordance with the preferred embodiment, in addition to generating test patterns, the IC testing software 39 being executed by computer 40 of the present invention analyzes the test results. Preferably, the test results are stored in a database, such as database 31 shown as being in communication with the IC tester 30 and with the computer 40.

Figure 4:
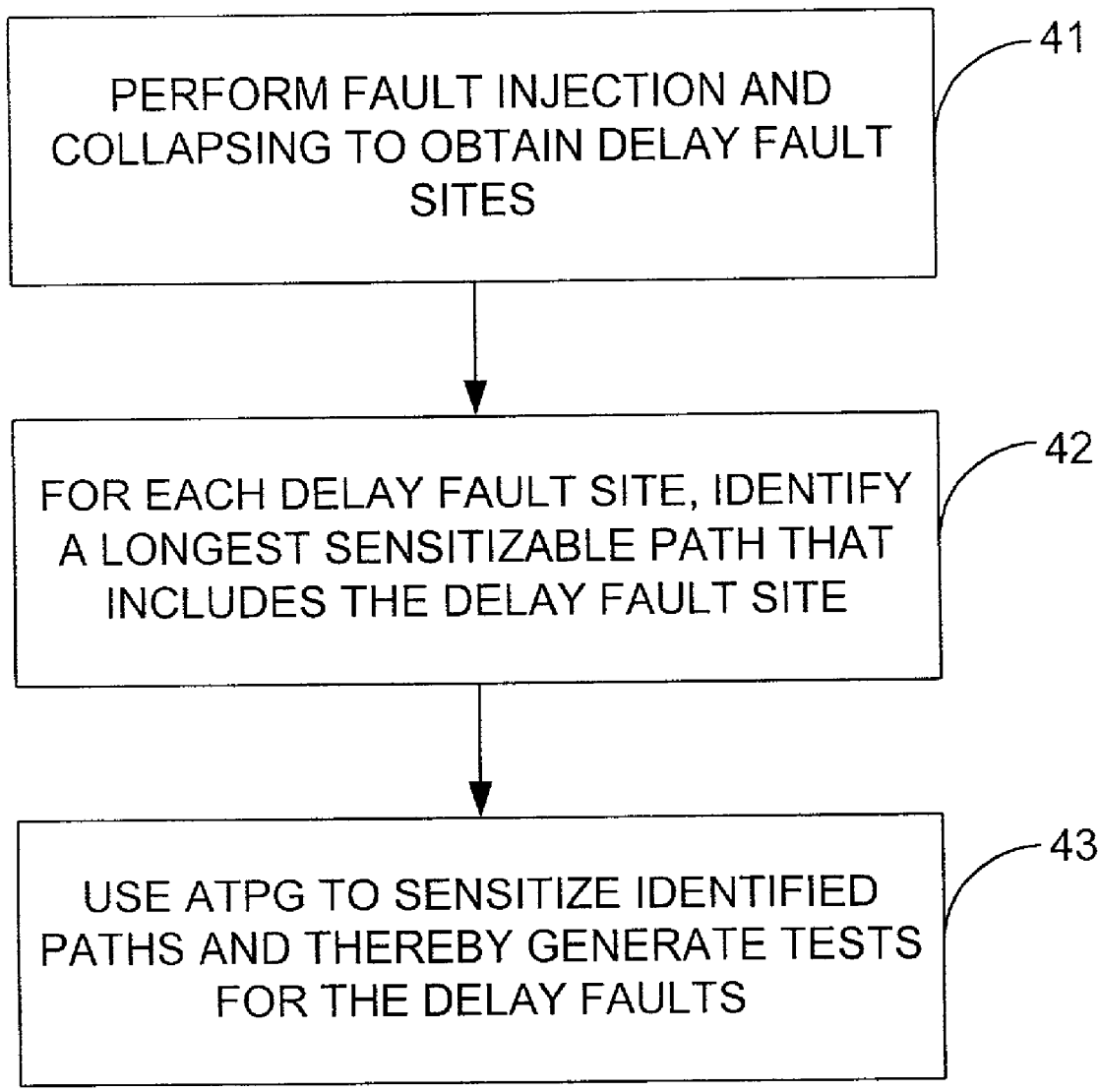
FIG. 4 is a flow chart demonstrating an example embodiment of the method of the present invention, which can be embodied in test generation software such as that shown in FIG. 3.

FIG. 4 is a flow chart illustrating the method of the present invention in accordance with an example embodiment for generating a bounded set of delay fault tests. As indicated by the block 41, fault injection and collapsing are performed based on the transition fault sites in the aforementioned manner such that a limited number of delay fault sites, preferably no more than two per node, are selected for the circuit. For each of these fault sites, the longest sensitizable path that includes the fault site is determined, as indicated by block 42. Once these paths have been identified, the computer 40 executes an Automatic Test Pattern Generation (ATPG) algorithm of the IC testing software 39, which sensitizes the identified paths and generates tests for testing the identified paths, as indicated by block 43.

It should be noted that a number different than two paths per transition fault site could be used, but one of the goals of the present invention is to limit the exponential explosion of the number of paths. By using two paths per transition fault site, the number of path tests that need to be generated is bounded In fact, due to two aspects of the present invention, namely, a) fault collapsing and b) the fact that long paths will pass through many different transition fault sites, there will probably be considerably fewer paths needed than two per transition fault site in order to properly test an IC. However, two paths per transition fault site preferably is an upper bound.

The result of the method represented by the flow chart of FIG. 4 is a set of tests through all of the transition fault sites that use the longest valid (i.e., sensitizable) path through each site. This results in better global test coverage of point defects than with tests that utilize only a subset of the longest paths. In addition, in accordance with the present invention, the most sensitive paths through the faults are used to implement the transition fault tests. Also, there is no loss of test coverage due to the rejection of unsensitizable paths, which in the past has left some nodes untested when the known path delay fault model was used. Furthermore, when determining the longest sensitizable paths through fault sites, a large amount of information is obtained, and this information is retained in memory, such as in database 31, so that it can be fully used when generating transition fault tests.

Figure 5:
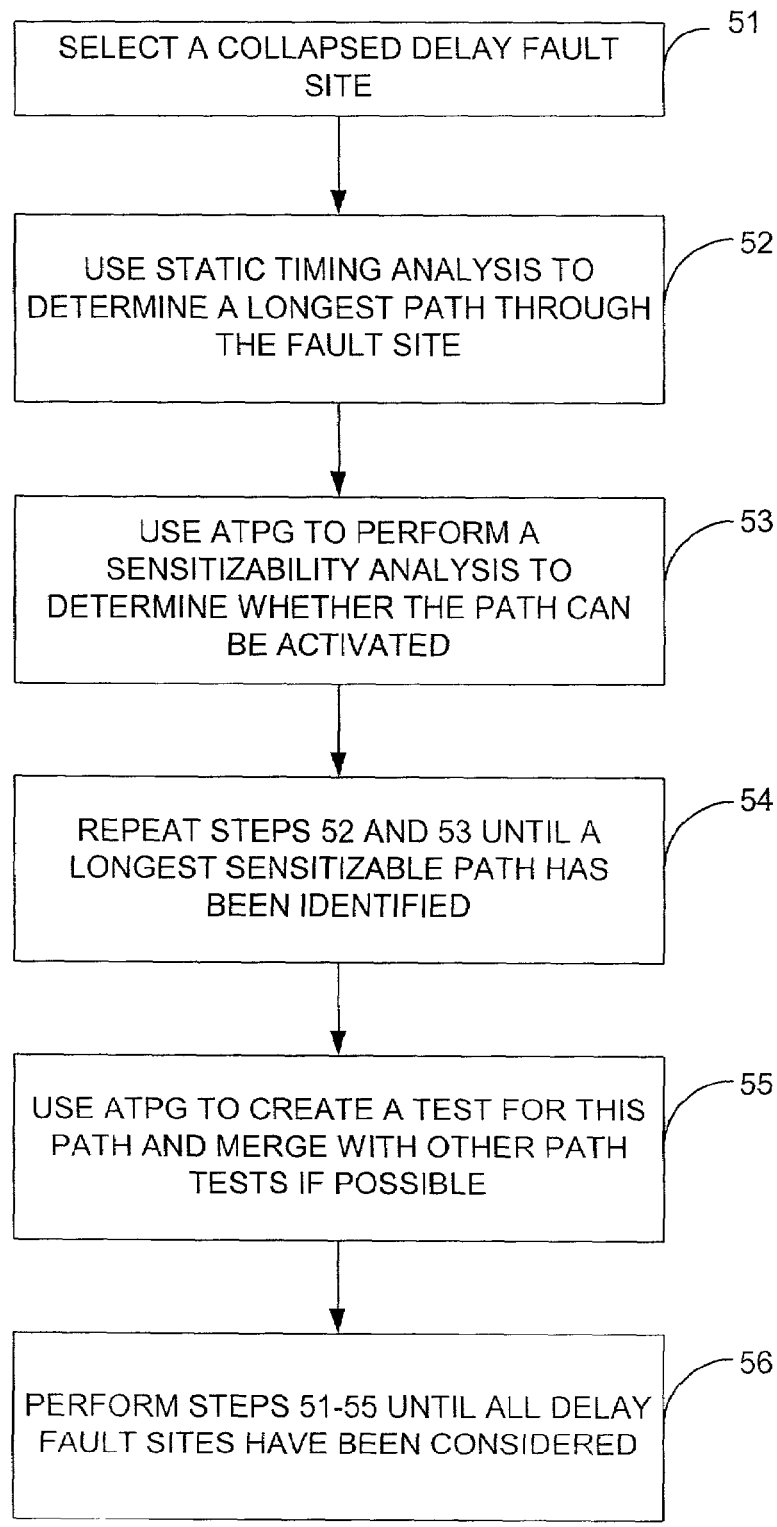
FIG. 5 is a flow chart demonstrating the preferred embodiment of the method of the present invention, which can be embodied in test generation software such as that shown in FIG. 3.

FIG. 5 is a flow chart illustrating the preferred embodiment for generating a bounded set of delay fault tests that can be used to provide global delay defect testing for an IC. For each collapsed transition fault site selected in block 51, static timing analysis is used to identify the longest path through the fault site, as indicated by block 52. Once the longest path has been identified, a sensitizability analysis is used to determine whether the path can be activated, as indicated by block 53. Steps 52 and 53 are repeated until a longest sensitizable path through the fault site has been found, as indicated by block 54. ATPG is then used to create a test using this longest sensitizable path through the transition fault site under consideration and attempt to merge this test with previous tests to reduce any test path redundancy, as indicated by block 55. Steps 51–55 are repeated until a bounded set of test patterns has been generated for the entire IC, as indicated by block 56.

It should be noted that the present invention has been described with reference to particular embodiments. However, as will be understood by persons skilled in the art in view of the discussion provided herein, the present invention is not limited to the particular embodiments described herein. For example, it is well known that logic can be implemented in different ways and with different components to achieve the same result. Therefore, it will be understood that the particular logic designs shown in FIG. 1 has logical equivalents that are also covered by the present invention although they have not been specifically described herein. These and other modifications are within the scope of the present invention.

What is claimed is:

1. An apparatus for generating test patterns used to test an integrated circuit (IC), the apparatus comprising:
    first logic, the first logic determining a subset of transition fault sites on an IC to be tested;
    second logic, the second logic using static timing analysis to identify a longest sensitizable path through each transition fault site of the subset of transition fault sites; and
    third logic, the third logic generating files comprising a bounded set of test patterns that test the identified longest sensitizable paths through each transition fault site of the subset of transition fault sites.

2. The apparatus of claim 1, wherein the first logic determines said subset by limiting a number of transition fault sites such that there are, at most, two paths per transition fault site of the subset of transition fault sites.

3. The apparatus of claim 1, wherein said first, second and third logic correspond to an IC testing software being executed by a computer.

4. The apparatus of claim 1, wherein the second logic first identifies the longest sensitizable path through each transition fault site of the subset of fault sites and then performs a sensitizability analysis on each of the identified longest paths to determine whether each of the identified longest paths can be activated.

5. The apparatus of claim 1, wherein the third logic uses an Automatic Test Pattern Generation algorithm to generate said bounded set of test patterns for testing the subset of fault sites.

6. An apparatus for generating test patterns used to test an integrated circuit (IC), the apparatus comprising:
    first logic, the first logic determining a subset of transition fault sites on an IC to be tested by limiting a number of transition fault sites to two transition fault sites per node of combinational logic within the IC being tested;
    second logic, the second logic using static timing analysis to identify a longest path through each transition fault site of the subset of transition fault sites, the second logic identifying whether each identified longest path can be activated to determine whether each identified longest path is sensitizable; and
    third logic, the third logic using an Automatic Test Pattern Generation algorithm to generate files comprising a bounded set of test patterns that test the identified longest sensitizable paths through each transition fault site of the subset of transition fault sites.

7. The apparatus of claim 6, wherein said first second and third logic correspond to IC testing software being executed by a computer.

8. A method for generating test patterns used to test an integrated circuit (IC), the method comprising the steps of:
    determining a subset of transition fault sites on an IC to be tested;
    using static timing analysis to identify a longest sensitizable path through each transition fault site of the subset of transition fault sites; and
    generating files comprising a bounded set of test patterns that test the identified longest sensitizable paths through each transition fault site of the subset of transition fault sites.

9. The method of claim 8, wherein the determining step determines said subset by limiting a number of transition fault sites such that there are, at most two paths per transition fault site of combinational logic within the IC being tested.

10. The method of claim 8, wherein the method is performed by IC testing software being executed by a computer.

11. The method of claim 10, wherein the generating step includes the step of executing an Automatic Test Pattern Generation algorithm on a computer to generate said bounded set of test patterns for testing the subset of fault sites.

12. The method of claim 8, wherein the identifying step includes the steps of identifying the longest paths through each fault site of the subset of fault sites and then performing a sensitizability analysis on each of the identified longest paths to determine whether each of the identified longest paths can be activated.

13. A computer program for generating test patterns used to test an integrated circuit (IC), the computer program being stored on a computer readable medium, the computer program comprising:
    a first routine, the first routine determining a subset of transition fault sites on an IC to be tested;
    a second routine, the second routine using static timing analysis to identify a longest sensitizable path through each transition fault site of the subset of transition fault sites; and
    a third routine, the third routine generating files comprising a bounded set of test patterns that test the identified longest sensitizable paths through each transition fault site of the subset of transition fault sites.

14. The computer program of claim 13, wherein the first routine determines said subset by limiting a number of transition fault sites such that there are, at most, two paths per transition fault site of combinational logic within the IC being tested.

15. The computer program of claim 13, wherein the computer program is IC testing software that includes the first, second and third routines.

16. A method for generating test patterns used to test an integrated circuit (IC), the method comprising the steps of:
   determining a subset of transition fault sites on an IC to be tested by limiting a number of transition fault sites such that there are, at most, two paths per transition fault site of combinational logic within the IC being tested;
   using static timing analysis to identify a longest path through each transition fault site of the subset of transition fault sites, and then identifying whether each identified longest path can be activated to determine whether each identified longest path is sensitizable; and
   executing en Automatic Test Pattern Generation algorithm on a computer to generate a bounded set of test patterns that test the identified longest sensitizable paths through each transition fault site of the subset of transition fault sites.

17. A computer program for generating test patterns used to test an integrated circuit (IC), the computer program being stored on a computer readable medium, the computer program comprising:
   a first routine, the first routine determining a subset of transition fault sites on an IC to be tested by limiting a number of transition fault sites such that there are, at most two paths per transition fault site of combinational logic within the IC being tested;
   a second routine, the second routine, using static timing analysis to identify a longest path through each transition fault site of the subset of transition fault sites, and then identifying whether each identified longest path can be activated to determine whether each identified longest path is sensitizable; and
   a third routine, the third routine corresponding to an Automatic Test Pattern Generation algorithm for execution by an IC tester in which the IC being tested is installed to generate a bounded set of test patterns that test the identified longest sensitizable paths through each transition fault site of the subset of transition fault sites.

* * * * *

UNITED STATES PATENT AND TRADEMARK OFFICE
CERTIFICATE OF CORRECTION

PATENT NO. : 7,039,845 B2
APPLICATION NO. : 10/109018
DATED : May 2, 2006
INVENTOR(S) : Jeff Rearick It is certified that error appears in the above-identified patent and that said Letters Patent is hereby corrected as shown below:

Title page, Item [76] Col. 1 (Inventors) Line 3-4 Delete "3501 S. Stover Apt. #149, Fort Collins, CO (US) 80525" and insert -- 110 West Stoughton #305, Urbana, IL 61801 --, therefor.

Col. 10 Line 22 In Claim 7, delete "first" and insert -- first, --, therefor.

Col. 10 Line 38 In Claim 9, delete "most" and insert -- most, --, therefor.

Col. 11 Line 21 In claim 16, delete "en" and insert -- an --, therefor.

Col. 12 Line 8 In Claim 17, delete "most" and insert -- most, --, therefor.

Signed and Sealed this

Seventeenth Day of February, 2009

JOHN DOLL
*Acting Director of the United States Patent and Trademark Office*